(12) United States Patent
Schrauwen

(10) Patent No.: US 8,759,433 B2
(45) Date of Patent: *Jun. 24, 2014

(54) AROMATIC POLYCARBONATE COMPOSITION

(75) Inventor: Bernardus Antonius Gerardus Schrauwen, Sterksel (NL)

(73) Assignee: Mitsubishi Chemical Europe GmbH, Dusseldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/517,325

(22) PCT Filed: Dec. 20, 2010

(86) PCT No.: PCT/EP2010/070228

§ 371 (c)(1),
(2), (4) Date: Sep. 4, 2012

(87) PCT Pub. No.: WO2011/076730

PCT Pub. Date: Jun. 30, 2011

(65) Prior Publication Data

US 2012/0329933 A1  Dec. 27, 2012

(30) Foreign Application Priority Data

Dec. 21, 2009  (EP) .................................. 09180079
May 28, 2010  (EP) .................................. 10164276

(51) Int. Cl.
*C08K 3/32*  (2006.01)

(52) U.S. Cl.
USPC ............................ 524/417; 524/407; 524/414

(58) Field of Classification Search
USPC ........................................ 524/407, 414, 417
See application file for complete search history.

(56) References Cited

U.S. PATENT DOCUMENTS

| 6,207,344 | B1 | 3/2001 | Ramlow et al. |
| 2009/0292048 | A1 | 11/2009 | Li et al. |
| 2012/0329922 | A1* | 12/2012 | Schrauwen .................. 524/165 |

FOREIGN PATENT DOCUMENTS

| WO | WO 01/23189 | 4/2001 |
| WO | WO 2009/024496 | 2/2009 |
| WO | WO 2009/141799 | 11/2009 |

OTHER PUBLICATIONS

International Preliminary Report on Patentability, dated 26 Jun. 2012, in International Application No. PCT/EP2010/070228.
International Search Report for PCT/EP2010/070228, mailed Feb. 9, 2011.
Written Opinion for PCT/EP2010/070228, mailed Feb. 9, 2011.
U.S. Appl. No. 13/517,328, filed Sep. 4, 2012; Inventor: Schrauwen.
International Search Report for PCT/EP2010/070227, mailed Mar. 21, 2011.
Written Opinion for PCT/EP2010/070227, mailed Mar. 21, 2011.
International Preliminary Report on Patentability (IPRP) dated Jun. 26, 2012 in related PCT international application No. PCT/EP2010/070227.

* cited by examiner

*Primary Examiner* — Peter Szekely
(74) *Attorney, Agent, or Firm* — Nixon & Vanderhye P.C.

(57) ABSTRACT

The present invention relates to a polymer composition comprising the following components: a) 76.6-99.49 mass % of aromatic polycarbonate, b) 0.5-20 mass % of laser direct structuring additive, c) 0-2.4 mass % of rubber like polymer, and d) 0.01-1 mass % of acid and/or acid salt wherein the mass % is calculated relative to the sum of a), b), c) and d). The invention also relates to a moulded part containing this composition, to a circuit carrier containing such moulded part and to a process for producing such circuit carrier.

11 Claims, No Drawings

AROMATIC POLYCARBONATE COMPOSITION

This application is the U.S. national phase of International Application No. PCT/EP2010/070228 filed 20 Dec. 2010 which designated the U.S. and claims priority to EP Patent Application Nos. 09180079.7 filed 21 Dec. 2009 and 10164276.7 filed 28 May 2010, the entire contents of each of which are hereby incorporated by reference.

The present invention relates to a polymer composition comprising a polymer, in particular an aromatic polycarbonate, and a laser direct structuring additive. The invention also relates to a process for producing such a composition, to a moulded part containing this composition, to a circuit carrier containing such moulded part and to a process for producing such circuit carrier.

Polymer compositions comprising a polymer and a laser direct structuring (LDS) additive which additive is capable of being activated by laser radiation and thereby forming elemental metal nuclei, are for example described in U.S. Pat. No. 2,706,0421 and WO-A-2009024496. Such polymer compositions can advantageously be used in a LDS process for producing a non-conductive part on which conductive tracks are to be formed by irradiating areas of said part with laser radiation to activate the plastic surface at locations where the conductive path is to be situated and break down the laser direct structuring additive(s) and release metal nuclei, and subsequently metalizing the irradiated areas to accumulate metal on these areas. WO-A-2009024496 describes aromatic polycarbonate compositions containing a metal compound capable of being activated by electromagnetic radiation and thereby forming elemental metal nuclei and 2.5-50 mass % of a rubber like polymer, the latter being added to reduce degradation of the polycarbonate due to the presence of such metal compound in aromatic polycarbonate compositions.

It has now been found that the use of such a composition may result in that the irradiated areas that have been subjected to metallization are not homogeneously metalized. This is manifested in the existence of pores in the metalized areas or in that thickness of the metal accumulation is not uniform over the metalized areas. A pore is generated in case metal is not accumulated on the irradiated area during the metalizing step. Such pores may be generated in particular in case the metalizing is effected such that the maximum thickness of the accumulated metal, in particular copper, is less than 5 µm. A non-uniform thickness over the metalized area means that metal is accumulated on each irradiated area, but the thickness of the metal accumulation on at least one irradiated area is less than the thickness on the other irradiated areas. Such non-uniform thickness may in particular develop in case the metalizing is effected such that the maximum thickness of the accumulated metal, in particular copper, is higher than 5 µm.

The object of the present invention is to provide an aromatic polycarbonate composition comprising a laser direct structuring additive that does not show said drawback or shows it to a lesser extent.

This object is achieved in that the polymer composition comprises the following components:
  a) 76.6-99.49 mass % of aromatic polycarbonate,
  b) 0.5-20 mass % of laser direct structuring additive,
  c) 0-2.4 mass % of rubber like polymer, and
  d) 0.01-1 mass % of acid and/or acid salt
wherein the mass % is calculated relative to the sum of components a), b), c) and d).

It has surprisingly been found that with the composition according to the invention the metal accumulation, obtained by metallization of the irradiated areas on moulded parts obtained from such a composition, is more homogeneously over the metalized area, as manifested in the existence of less pores in the metalized area or in that the thickness of the metal accumulation is more uniform over the metalized area. An additional advantage of the composition according to the invention is that the average thickness of the metal layer is increased, i.e. more metal is accumulated on the irradiated area during metallization.

In particular, it has surprisingly been found that the use of an acid or acid salt in a composition comprising aromatic polycarbonate and a laser direct structuring additive and being substantially free of a rubber like polymer results in that the accumulation of metal, obtained by metallization of the irradiated areas of moulded parts obtained from such a composition, can be improved, as manifested by a more homogeneous accumulation of the metal over the metalized area. An additional advantage of the use of an acid or acid salt in such a composition is that the average thickness of the metalized areas is increased. The present invention therefore also relates to the use of an acid or acid salt in a composition comprising aromatic polycarbonate and a laser direct structuring additive and being substantially free of a rubber like polymer for increasing the homogeneity of metalized areas obtained by metallization of the irradiated areas of moulded parts obtained from such a composition. As used herein, substantially free of rubber like polymer means that the amount of rubber like polymer in the composition containing aromatic polycarbonate and laser direct structuring additive is at most 2.4 mass %, calculated relative to the sum of the amounts of aromatic polycarbonate, laser direct structuring additive, rubber like polymer, acid and acid salt. Preferably, the amount of rubber like polymer is less than 2 mass %, more preferably less than 1.5 mass %, more preferably less than 1 mass % and even more preferably 0 mass % of rubber like polymer.

The composition contains an acid or an acid salt (component d)). In one embodiment, the acid or acid salt is an inorganic acid or inorganic acid salt. In one embodiment, the composition contains a phosphorous containing oxy-acid and/or an acid salt thereof. Preferably, the phosphorous containing oxy-acid is a multi-protic phosphorus containing oxy-acid having the general formula $H_mP_tO_n$, where m and n are each 2 or greater and t is 1 or greater. Examples of such acids include, but are not limited to, acids represented by the following formulas: $H_3PO_4$, $H_3PO_3$, and $H_3PO_2$. Non-limited examples of phosphorus containing oxy-acids are phosphoric acid, phosphorous acid, hypophosphorous acid, hypophosphoric acid, phosphinic acid, phosphonic acid, metaphosphoric acid, hexametaphosphoric acid, thiophosphoric acid, fluorophosphoric acid, difluorophosphoric acid, fluorophosphorous acid, difluorophosphorous acid, fluorohypophosphorous acid, or fluorohypophosphoric acid. In a preferred embodiment of the invention, the composition contains $H_3PO_4$, $H_3PO_3$, $H_3PO_2$ and/or an acid salt of $H_3PO_4$, $H_3PO_3$ or of $H_3PO_2$. In a more preferred embodiment of the invention, the composition contains $H_3PO_4$, $H_3PO_3$ and/or an acid salt of $H_3PO_4$ or of $H_3PO_3$. Non-limiting examples of acid salts of $H_3PO_4$ are mono zinc phosphate, mono calcium phosphate and mono natrium phosphate. Preferably, component d) is $H_3PO_4$, $H_3PO_3$, $H_3PO_2$ and/or an acid salt of $H_3PO_4$, $H_3PO_3$ or of $H_3PO_2$ or a mixture thereof. More preferably, component d) is $H_3PO_4$, $H_3PO_3$, and/or the Zn salt of $H_3PO_4$ or of $H_3PO_3$ or a mixture thereof.

The composition contains rubber like polymer in an amount of from 0 up to and including 2.4 mass %. Preferably, the amount of rubber like polymer is less than 2 mass %, more preferably less than 1.5 mass %, more preferably less than 1 mass % and even more preferably 0 mass % of rubber like polymer. In a preferred embodiment of the present invention, the composition does not contain rubber like polymer. The rubber-like polymer is or contains an elastomeric (i.e. rubbery) polymer having preferably a $T_g$ less than about 10° C. Examples of elastomeric polymers include polyisoprene; butadiene based rubbers like polybutadiene, styrene-butadiene random copolymer and block copolymer, hydrogenates of said block copolymers, acrylonitrile-butadiene copolymer and butadiene-isoprene copolymer; acrylate based rubbers like ethylene-methacrylate and ethylene-butylacrylate, acrylate ester-butadiene copolymers, for example acrylic elastomeric polymers such as butylacrylate-butadiene copolymer; siloxane based rubbers like polyorganosiloxanes such as for example polydimethylsiloxane, polymethylphenylsiloxane and dimethyl-diphenylsiloxane copolymer; and other elastomeric polymers like ethylene-propylene random copolymer and block copolymer, copolymers of ethylene and α-olefins, copolymers of ethylene and aliphatic vinyl such as ethylene-vinyl acetate, and ethylene-propylene non-conjugated diene terpolymers such as ethylene-propylene-hexadiene copolymer, butylene-isoprene copolymer, and chlorinated polyethylene.

The polycarbonate composition according to the invention contains inter alia from 76.6 up to 99.49 mass % of aromatic polycarbonate, preferably from 77 up to 98.99 mass %, preferably from 87.5 up to 96.99 mass %, more preferably from 88 up to 95.99 mass % of aromatic polycarbonate, even more preferably from 89 up to 94.99 mass % of aromatic polycarbonate. Suitable aromatic polycarbonates are polycarbonates made from at least a divalent phenol and a carbonate precursor, for example by means of the commonly known interfacial polymerization process or the melt polymerisation method. Suitable divalent phenols that may be applied are compounds having one or more aromatic rings that contain two hydroxy groups, each of which is directly linked to a carbon atom forming part of an aromatic ring. Examples of such compounds are 4,4'-dihydroxybiphenyl, 2,2-bis(4-hydroxyphenyl)propane (bisphenol A), 2,2-bis(4-hydroxy-3-methylphenyl)propane, 2,2-bis-(3-chloro-4-hydroxyphenyl)-propane, 2,2-bis-(3,5-dimethyl-4-hydroxyphenyl)-propane, 2,4-bis-(4-hydroxyphenyl)-2-methylbutane, 2,4-bis-(3,5-dimethyl-4-hydroxyphenyl)-2-methylbutane, 4,4-bis(4-hydroxyphenyl)heptane, bis-(3,5-dimethyl-4-hydroxyphenyl)-methane, 1,1-bis-(4-hydroxyphenyl)-cyclohexane, 1,1-bis-(3,5-dimethyl-4-hydroxyphenyl)-cyclohexane, 2,2-(3,5,3',5'-tetrachloro-4,4'-dihydroxydiphenyl)propane, 2,2-(3,5,3',5'-tetrabromo-4,4'-dihydroxydiphenyl)propane, (3,3'-dichloro-4,4'-dihydroxyphenyl)methane, bis-(3,5-dimethyl-4-hydroxyphenyl)-sulphon, bis-4-hydroxyphenylsulphon, bis-4-hydroxyphenylsulphide.

The carbonate precursor may be a carbonyl halogenide, a halogen formate or carbonate ester. Examples of carbonyl halogenides are carbonyl chloride and carbonyl bromide. Examples of suitable halogen formates are bis-halogen formates of divalent phenols such as hydroquinone or of glycols such as ethylene glycol. Examples of suitable carbonate esters are diphenyl carbonate, di(chlorophenyl)carbonate, di(bromophenyl)carbonate, di(alkylphenyl)carbonate, phenyltolylcarbonate and the like and mixtures thereof. Although other carbonate precursors may also be used, it is preferred to use the carbonyl halogenides and in particular carbonylchloride, also known as phosgene.

The aromatic polycarbonates in the composition according to the invention may be prepared using a catalyst, an acid acceptor and a compound for controlling the molecular mass.

Examples of catalysts are tertiary amines such as triethylamine, tripropylamine and N,N-dimethylaniline, quaternary ammonium compounds such as tetraethylammoniumbromide and quaternary phosphonium compounds such as methyltriphenylfosfoniumbromide.

Examples of organic acid acceptors are pyridine, triethylamine, dimethylaniline and so forth. Examples of inorganic acid acceptors are hydroxides, carbonates, bicarbonates and phosphates of an alkali metal or earth alkali metal.

Examples of compounds for controlling the molecular mass are monovalent phenols such as phenol, p-alkylphenols and para-bromophenol and secondary amines.

Such polycarbonates, their preparation and properties are described in detail in for example Encycl. Polym. Sci. Eng., 11, p. 648-718 (Wiley, New York, 1988) and in Kunststoff Handbuch, 3/1, p. 117-297 (Hauser Verlag, Muenchen, 1992).

The composition according to the invention preferably contains a polycarbonate derived from bisphenol A and phosgene and optionally minor amounts of other compounds having one, two or more than two reactive groups as comonomers, for instance for controlling the melt viscosity.

The polycarbonate composition contains a laser direct structuring additive (component b)) that enables the composition to be used in a laser direct structuring (LDS) process. In a LDS process, a laser beam exposes the LDS additive to place it at the surface of the polycarbonate composition and to release metal nuclei from the LDS additive. As such, the LDS additive is selected such that, upon exposure to a laser beam, metal atoms are activated and exposed and in areas not exposed by the laser beam, no metal atoms are exposed.

Component b) is capable of being activated by laser radiation and thereby forming elemental metal nuclei within the polycarbonate composition. The component b) is a metal-containing (inorganic or organic) compound which as a consequence of absorption of laser radiation liberates metal in elemental form. It is also possible that the radiation is not directly absorbed by the metal-containing compound, but is absorbed by other substances which then transfer the absorbed energy to the metal-containing compound and thus bring about the liberation of elemental metal. The laser radiation may be UV light (wavelength from 100 to 400 nm), visible light (wavelength from 400 to 800 nm), or infrared light (wavelength from 800 to 25 000 nm). Other preferred forms of radiation are X-rays, gamma rays, and particle beams (electron beams, [alpha]-particle beams, and [beta]-particle beams). The laser radiation is preferably infrared light radiation, more preferably with a wavelength of 1064 nm. Examples of LDS additives useful in the present invention include for example copper chromium oxide spinel, copper molybdenum oxide spinel, a copper salt, such as for example copper hydroxide phosphate; copper phosphate and copper sulphate.

The component b) capable of being activated by laser radiation is preferably comprised of electrically non-conductive high-thermal-stability organic or inorganic metal compounds which are preferably insoluble and stable in aqueous acidic or alkaline metalizing baths. Particularly suitable compounds are those which absorb a very large proportion of the light at the wavelength of the incident light. Compounds of this type are described in EP-A-1 274 288. Preference is given here to compounds of metals of the d and f group of the Periodic Table of the Elements with non-metals. The metal-containing compounds are particularly preferably metal oxides, in particular oxides of the d-metals of the Periodic Table of the Elements. Higher metal oxides which contain at least two different kinds of cations and have a spinel structure or spinel-related structure, and which remain unchanged in non-irradiated areas of the moulded part that contains the composition of the present invention are particularly suitable. In one particularly preferred embodiment of the invention, the higher oxides are spinels, in particular copper-containing spinels, such as $CuCr_2O_4$. Suitable copper-containing spinels are commercially available, an example being PK 3095 from Ferro (DE) or 34E23 or 34E30 from Johnson Matthey (DE). Copper oxides of the formula CuO or $Cu_2O$ are also particularly suitable, and use is preferably made here of nanoparticles, such as NANOARC® Copper Oxide from Nanophase Technologies Corporation, Illinois, USA. In another particularly preferred embodiment of the invention, the higher spinel oxide is a manganese-containing spinel. As will be understood by a man skilled in the art also a mixture of metal compounds can be used.

Preferably, the metal compound is represented by the chemical formula $AB_2O_4$ or $B(AB)O_4$. The A component of the formulas is a metal cation having a valence of 2 and is selected from the group consisting of cadmium, zinc, copper, cobalt, magnesium, tin, titanium, iron, aluminum, nickel, manganese, chromium, and combinations of two or more of these. The B component of the formulas is a metal cation having a valence of 3 and is selected from the group consisting of cadmium, manganese, nickel, zinc, copper, cobalt, magnesium, tin, titanium, iron, aluminum, chromium, and combinations of two or more of these.

The polymer compositions of the invention have dispersed therein metal compound(s), where the metal compound preferably comprises two or more metal oxide cluster configurations within a definable crystal formation. The overall crystal formation, when in an ideal (i.e., non-contaminated, non-derivative) state, has the following general formula:

$$AB_2O_4,$$

where
i. A is selected from the group consisting of cadmium, zinc, copper, cobalt, magnesium, tin, titanium, iron, aluminum, nickel, manganese, chromium, and combinations thereof, which provides the primary cation component of a first metal oxide cluster ("metal oxide cluster 1") typically a tetrahedral structure,
ii. B is selected f from the group consisting of cadmium, manganese, nickel, zinc, copper, cobalt, magnesium, tin, titanium, iron, aluminum, chromium, and combinations thereof and which provides the primary cation component of a second metal oxide cluster ("metal oxide cluster 2") typically an octahedral structure,
iii. where within the above groups A or B, any metal cation having a possible valence of 2 can be used as an "A", and any metal cation having a possible valence of 3 can be used as a "B",
iv. where the geometric configuration of "metal oxide cluster 1" (typically a tetrahedral structure) is different from the geometric configuration of "metal oxide cluster 2" (typically an octahedral structure),
v. where a metal cation from A and B can be used as the metal cation of "metal oxide cluster 2" (typically the octahedral structure), as in the case of an 'inverse' spinel-type crystal structure,
vi. where O is primarily, if not exclusively, oxygen; and
vii. where the "metal oxide cluster 1" and "metal oxide cluster 2" together provide a singular identifiable crystal type structure having heightened susceptibility to electromagnetic radiation.

The concentration of these components b) present in the composition of the present invention is from 0.5 up to 20 mass %, preferably from 1 up to 20 mass %, preferably from 3 up to 10 mass %, more preferably from 4 up to 10 mass %, and particularly preferably from 5 up to 10 mass %.

In a preferred embodiment, the composition according to the invention contains a) 77-98.99 mass % of aromatic polycarbonate, b) 1-20 mass % of laser direct structuring additive, c) 0-2 mass % of rubber like polymer, and d) 0.01-1 mass % of acid and/or acid salt, relative to the sum of a), b), c) and d). In another preferred embodiment, the composition according to the invention contains a) 87.5-96.99 mass % of aromatic polycarbonate, b) 3-10 mass % of laser direct structuring additive, c) 0-1.5 mass % of rubber like polymer, and d) 0.01-1 mass % of acid and/or acid salt. In another preferred embodiment, the composition according to the invention contains a) 88-95.99 mass % of aromatic polycarbonate, b) 4-10 mass % of laser direct structuring additive,
c) 0-1 mass % of rubber like polymer, and d) 0.01-1 mass % of acid or acid salt. In still another preferred embodiment, the composition according to the invention contains a) 89-94.99 mass % of aromatic polycarbonate, b) 5-10 mass % of laser direct structuring additive, c) 0 mass % of rubber like polymer, and d) 0.01-1 mass % of acid and/or acid salt.

The polycarbonate composition according to the invention may further comprise from 0 up to 25 mass % of one or more other additives, relative to the total weight of components a), b), c) and d). These include the customary additives such as stabilizers against thermal or thermo-oxidative degradation, stabilizers against hydrolytic degradation, stabilizers against degradation from light, in particular UV light, and/or photo-oxidative degradation, impact modifiers, processing aids such as release agents and lubricants, colorants such as pigments and dyes, fillers including minerals such as wollastonite or aluminium silicates. Suitable examples of such additives and their customary amounts are stated in the aforementioned Kunststoff Handbuch, 3/1.

The polymer composition may further comprise reinforcing agents, such as glass fibres. The polymer composition may comprise between 0 and 30 wt % glass fibres, relative to the sum of a), b), c) and d), preferably between 0 and 20 wt %.

The components b), c) (if present) and d) and optionally other additives as described above, and also any other additives and reinforcing agents may be introduced into the aromatic polycarbonate by means of suitable mixing devices such as single-screw or twin-screw extruders, preferably a twin-screw extruder is used. Preferably, aromatic polycarbonate pellets are introduced into the extruder together with at least components b) and d) and extruded, then quenched in a water bath and then pelletized. The invention therefore further relates to a process for producing an aromatic polycarbonate composition according to the present invention by melt mixing components a), b), d) and optionally c) and other (particulate) additives and reinforcing agents.

The invention further relates to moulded parts that contains the polycarbonate composition according to the present invention. The invention relates in particular to a moulded part produced by injection moulding of the composition according to the invention. The invention further also relates to an article, in particular a circuit carrier, that contains a moulded part produced from the composition according to the invention. In one embodiment, such a circuit carrier is used for producing an antenna.

The invention further relates to a process for producing such a circuit carrier which process comprises the steps of providing a moulded part that contains the polycarbonate composition according to the present invention, irradiating areas of said part on which conductive tracks are to be formed with laser radiation to break down the LDS additive b) and releasing metal nuclei, and subsequently metallizing the irradiated areas. In a preferred embodiment, laser is used to simultaneously release metal nuclei and effect ablation of the part while forming an adhesion-promoting surface. This provides a simple means to achieve excellent adhesive strength of the deposited metallic conductor tracks. The wavelength of the laser is advantageously 248 nm, 308 nm, 355 nm, 532 nm, 1064 nm or of even 10600 nm. The deposition of further metal onto the metal nuclei generated by laser radiation preferably takes place via plating processes. Said metallizing is preferably performed by immersing the moulded part in at least one electroless plating bath to form electrically conductive pathways on the irradiated areas of the moulded part. Non-limiting examples of electroless plating processes are a copper plating process, gold plating process, nickel plating process, silver plating, zinc plating and tin plating.

The invention will now be elucidated with reference to the following examples and comparative experiments.

COMPARATIVE EXPERIMENTS A-F AND EXAMPLES 1-4

The compositions of Comparative Experiments (CEx) A-F and of Examples (Ex) 1-4 were prepared from the components as given in Table 1.

All samples were extruded on a co-rotating twin screw extruder at a temperature of 280° C. according the compositions as given in Table 2 or 3. The extrudate was granulated and the collected granulate was injection moulded into plaques of 70*50*2 mm using a melt temperature of 290° C. to 310° C. depending on the viscosity of the material for the samples of Table 2 and using a melt temperature of 250° C. to 270° C. depending on the viscosity of the material for the samples of Table 3.

Plating performance was judged after laser activation on the injection molded plaques and a subsequent plating procedure in an electroless copper plating bath. Laser activation was done on a LPKF Microline 3D laser, using a laser wavelength of 1064 nm and a hatch size of 55 μm at a speed 4 m/s. In order to investigate the laser processing window, a matrix of in total 3×6 settings were used, varying the laser frequency over 3 levels from 60 kHz to 100 kHz and the laser power over 6 levels from 4 W to 10 W. Laser activated parts were cleaned to remove any laser debris and subsequently the activated areas were metalized in a MacDermid M-Copper 85 plating bath for about 1 hour. As a result, the injection moulded plaque contains 18 copper plated areas with an average thickness less than 5 μm. The plating performance was judged according to the average thickness and homogeneity (closed or porous) of the copper layer for the 18 copper plated areas. The homogeneity was visible judged.

Table 2 shows the compositions and results of Comparative Experiments (CEx) A to B and Examples (Ex) 1 to 4. Quality of the copper layer is given by the average copper thickness and level of homogeneity of all laser setting areas. The level of homogeneity is expressed by the percentage of laser setting areas that show a completely closed copper layer (no porosity).

If a laser setting area is completely covered by a copper layer, this area is considered to be homogenous. If an area shows one or more pores in the copper layer, this area is considered to be inhomogeneous.

The homogeneity of a sample is defined as the number of homogeneous areas devided by the total number of areas (homogeneous and inhomogenous) of the sample. For example, in case only 9 of the 18 copper plated areas show a completely closed copper layer and the other 9 show porosity, the homogeneity is considered to be 50%. The results show that the plating performance of Examples 1 to 4 is significantly improved to Comparative Experiments A to B, since the copper thickness is increased with more than 100% and all laser setting areas show a homogeneous layer structure (100% homogeneity).

TABLE 1

| Material | Type | Supplier |
|---|---|---|
| Polycarbonate (PC MFI = 23) | LVN (ISO 1628/4) = 43 ml/g | DSM |
| Polycarbonate (PC MFI = 8) | LVN (ISO 1628/4) = 51 ml/g | DSM |
| Polycarbonate (PC MFI = 3) | LVN (ISO 1628/4) = 60 ml/g | DSM |
| Mold release (MRA) | Loxiol P861/3.5 | Cognis |
| Heat Stabilizer (HS) | Irgafos 168 | Ciba |
| $CuCr_2O_4$ | Black 1G | Shepherd Company |
| MZP | Z 21-82 (Mono Zinc Phosphate) | Budenheim |
| ABS | Santac AT-05 | Mitsui Germany |
| MBS | KaneAce M511 | Kaneka |

TABLE 2

| | | Sample | | | | | |
|---|---|---|---|---|---|---|---|
| | Units | CEx A | Ex 1 | Ex 2 | Ex 3 | CEx B | Ex 4 |
| Components | | | | | | | |
| PC (MFI = 23) | % | 91.45 | 91.25 | | | | |
| PC (MFI = 8) | % | | | 91.40 | 91.05 | | |
| PC (MFI = 3) | % | | | | | 91.45 | 91.25 |
| $CuCr_2O_4$ | % | 8 | 8 | 8 | 8 | 8 | 8 |
| MZP | % | | 0.2 | 0.05 | 0.4 | | 0.2 |
| MRA + HS | % | 0.55 | 0.55 | 0.55 | 0.55 | 0.55 | 0.55 |
| Quality of Copper layer | | | | | | | |
| Thickness | μm | 0.96 | 2.49 | 2.85 | 3.14 | 1.44 | 3.81 |
| Homogeneity | % | 0 | 100 | 100 | 100 | 33 | 100 |

TABLE 3

| | | Sample | | | |
|---|---|---|---|---|---|
| | Units | CEx C | CEx D | CEx E | CEx F |
| Components | | | | | |
| PC (MFI = 4) | % | 56.45 | 56.25 | 56.45 | 71.25 |
| ABS | % | 30 | 30 | 35 | 15 |
| MBS | % | 5 | 5 | | |
| $CuCr_2O_4$ | % | 8 | 8 | 8 | 8 |
| MZP | % | | 0.2 | | 0.2 |
| MRA + HS | % | 0.55 | 0.55 | 0.55 | 0.55 |
| Quality of Copper layer | | | | | |
| Thickness | μm | 3.4 | 3.6 | 3.1 | 4.3 |
| Homogeneity | % | 17 | 17 | 0 | 17 |

The % in table 2 and 3 relate to the wt % of components relative to the total of the composition. From the comparative experiments C-F it is clear that the presence of rubber-like polymer such as ABS and MBS in substantial amounts, results in that accumulation of metal over the metalized areas is not homogeneously. This also holds in case small amounts of rubber like polymer is present (CEx F). Adding MZP (acid salt) to a composition containing rubber like polymer does not result in an improvement of the homogeneity (CEx D and F). Compositions containing polycarbonate, LDS additive, acid salt but not a rubber like polymer (CEx A and B) also suffer from low homogeneity of the metal accumulation and in addition the average thickness of the metal accumulation is low. Only the compositions according to the invention (Ex 1, 2, 3 and 4) show a very good homogeneity and in addition a sufficient average thickness of the accumulated metal.

The invention claimed is:

1. A polymer composition comprising the following components:
   a) 76.6-99.49 mass % of aromatic polycarbonate,
   b) 0.5-20 mass % of laser direct structuring additive,
   c) 0-2.0 mass % of rubber like polymer, and
   d) 0.01-1 mass % of an inorganic phosphorous containing oxy-acid and/or acid salt thereof, wherein
   the mass % is calculated relative to the sum of components a), b), c) and d), and wherein
   if present the rubber-like polymer is selected from the group consisting of polyisoprene, butadiene based rubbers, acrylate based rubbers, siloxane based rubbers, ethylene-propylene random and block copolymers, copolymers of ethylene and a-olefins, copolymers of ethylene and aliphatic vinyl, and ethylene-propylene non-conjugated diene terpolymers, butylene-isoprene copolymer and chlorinated polyethylene.

2. The polymer composition according to claim 1, wherein the composition further comprises from 0 up to 25 mass % of additives, wherein the amount is relative to the sum of components a), b), c) and d).

3. The polymer composition according to claim 1, wherein the composition comprises a copper containing spinel as laser direct structuring additive.

4. The polymer composition according to claim 1, wherein the composition comprises $CuCr_2O_4$ as laser direct structuring additive.

5. The polymer composition according to claim 1, wherein the composition does not contain a rubber-like polymer.

6. The polymer composition according to claim 1, wherein the composition contains $H_3PO_4$, $H_3PO_3$ and/or an acid salt of $H_3PO_4$ or of $H_3PO_3$.

7. The polymer composition according to claim 1, wherein if present the rubber-like polymer is an ethylene-vinyl acetate copolymer or an ethylene-propylene-hexadiene terpolymer.

8. The polymer composition according to claim 1, wherein component d) is mono zinc phosphate, mono calcium phosphate or mono sodium phosphate.

9. The polymer composition according to claim 1, wherein component d) is $H_3PO_4$, $H_3PO_3$ and/or the Zn salt of $H_3PO_4$ or of $H_3PO_3$ or a mixture thereof.

10. A moulded part comprising the polycarbonate composition according to claim 1.

11. A circuit carrier that comprises at least a moulded part according to claim 10.

* * * * *